(12) United States Patent
Fang et al.

(10) Patent No.: US 11,818,852 B2
(45) Date of Patent: Nov. 14, 2023

(54) FOLDING TERMINAL CONTROL METHOD AND APPARATUS, TERMINAL, AND STORAGE MEDIUM

(71) Applicant: BEIJING BYTEDANCE NETWORK TECHNOLOGY CO., LTD., Beijing (CN)

(72) Inventors: Chi Fang, Beijing (CN); Haizhou Zhu, Beijing (CN)

(73) Assignee: BEIJING BYTEDANCE NETWORK TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/884,885

(22) Filed: Aug. 10, 2022

(65) Prior Publication Data

US 2022/0386486 A1  Dec. 1, 2022

Related U.S. Application Data

(63) Continuation of application No. PCT/CN2021/081557, filed on Mar. 18, 2021.

(30) Foreign Application Priority Data

Mar. 31, 2020 (CN) .......................... 202010240988.4

(51) Int. Cl.
*H05K 5/02* (2006.01)
*H05K 5/00* (2006.01)
(Continued)

(52) U.S. Cl.
CPC ......... *H05K 5/0226* (2013.01); *G06F 1/1641* (2013.01); *H05K 5/0018* (2022.08); *H04M 1/0214* (2013.01); *H04M 1/72469* (2021.01)

(58) Field of Classification Search
CPC .. H05K 5/0226; H05K 5/0018; G06F 1/1641; G06F 2200/1614; G06F 2203/04803;
(Continued)

(56) References Cited

U.S. PATENT DOCUMENTS 10,642,485 B1 * 5/2020 Seo .................. G06F 1/1647
2012/0081277 A1 * 4/2012 de Paz .................. G06F 3/0483
345/156

(Continued)

FOREIGN PATENT DOCUMENTS

CN 107678826 A 2/2018
CN 107704177 A 2/2018
(Continued)

OTHER PUBLICATIONS

Hao H et al., Display Method for Terminal Device and Terminal Device, WO 2018094976 A1, English Translation, whole document. (Year: 2018).*

(Continued)

*Primary Examiner* — Marisol Figueroa

(57) ABSTRACT

Provided in embodiments of the disclosure are a folding terminal control method and apparatus, a terminal and a storage medium. A folding terminal is provided with a first display area and a second display area, and an included angle between the first display area and the second display area changes along with folding or unfolding of the folding terminal. The folding terminal control method includes: responding to an unfolding operation, opening at least one second application different from a first application in the second display area, wherein the first application is an application which is running by the folding terminal before responding to the unfolding operation, and the second application can be quickly called by changing unfolding and folding postures of the folding terminal, thereby improving the interactive use experience of a user.

8 Claims, 4 Drawing Sheets

(51) Int. Cl.
*G06F 1/16* (2006.01)
*H04M 1/02* (2006.01)
*H04M 1/72469* (2021.01)

(58) Field of Classification Search
CPC .... G06F 1/1652; G06F 1/1677; G06F 1/1694; G06F 3/0481; H04M 1/0214; H04M 1/72469; H04M 1/02; H04M 1/72448; H04M 1/72454; H04M 1/725; H04M 1/0241; H04M 1/0243; H04M 1/0268
See application file for complete search history.

(56) References Cited

U.S. PATENT DOCUMENTS

| | | | |
|---|---|---|---|
| 2015/0074598 A1* | 3/2015 | Yao | G06F 3/0488 715/803 |
| 2015/0145798 A1 | 5/2015 | Joo | |
| 2018/0242446 A1 | 8/2018 | Cho et al. | |
| 2021/0311683 A1* | 10/2021 | Jin | G09G 5/14 |
| 2022/0129041 A1* | 4/2022 | Kim | G06F 1/1677 |

FOREIGN PATENT DOCUMENTS

| | | | |
|---|---|---|---|
| CN | 107728809 A | 2/2018 | |
| CN | 109857495 A | 6/2019 | |
| CN | 109874038 A | 6/2019 | |
| CN | 110286865 A | 9/2019 | |
| CN | 110602273 A | 12/2019 | |
| CN | 110673889 A | 1/2020 | |
| EP | 2207076 A2 * | 7/2010 | ........... G06F 1/1616 |
| WO | WO-2018094976 A1 * | 5/2018 | ............. G06F 9/445 |

OTHER PUBLICATIONS

Search Report dated Jun. 17, 2021 in PCT/CN2021/081557, English translation (2 pages).

* cited by examiner

FOLDING TERMINAL CONTROL METHOD AND APPARATUS, TERMINAL, AND STORAGE MEDIUM

CROSS-REFERENCE

The disclosure is a continuation of PCT application Ser. No. PCT/CN2021/081557, titled "FOLDING TERMINAL CONTROL METHOD AND APPARATUS, TERMINAL, AND STORAGE MEDIUM", filed on Mar. 18, 2021, which claims priority to a Chinese patent application with the application number of 202010240988.4, filed on Mar. 31, 2020 by Beijing Bytedance Network Technology Co., Ltd., and titled "FOLDING TERMINAL CONTROL METHOD AND APPARATUS, TERMINAL, AND STORAGE MEDIUM", the entire contents of both of which are incorporated herein by reference.

FIELD

The present disclosure relates to the technical field of folding terminals, in particular to a folding terminal control method and apparatus, a terminal, and a storage medium.

BACKGROUND

Double-screen cell phones and folding-screen cell phones have a folded state and an unfolded state, part of a display screen is shown in the folded state, and the complete display screen is shown in the unfolded state. In the prior art, after a cell phone in the folded state is unfolded to be in the unfolded state, applications when the cell phone is in the folded state are only enlarged, thereby resulting in insufficient use experiences of a user.

SUMMARY

Embodiments of the disclosure provide a folding terminal control method and apparatus, a terminal, and a storage medium.

The present disclosure adopts the following technical solutions.

An embodiment of the disclosure provides a folding terminal control method, a folding terminal being provided with a first display area and a second display area between which an included angle changes along with folding or unfolding of the folding terminal, the folding terminal control method comprising:

responding to an unfolding operation, opening at least one second application different from a first application in the second display area;

wherein the first application is an application which is running by the folding terminal before responding to the unfolding operation.

An embodiment of the disclosure provides a folding terminal control method, a folding terminal being provided with a first display area and a second display area between which an included angle changes along with folding or unfolding of the folding terminal, the folding terminal control method comprising:

responding to an unfolding operation;

opening an application corresponding to folding angle information of the folding terminal, or accessing a mode corresponding to the folding angle information of the folding terminal.

An embodiment of the disclosure provides a folding terminal control apparatus, a folding terminal being provided with a first display area and a second display area between which an included angle changes along with folding or unfolding of the folding terminal, the folding terminal control apparatus, comprising:

a responding unit, used for responding to an unfolding operation;

a control unit, used for opening at least one second application different from a first application in the second display area;

wherein the first application is an application which is running by the folding terminal before responding to the unfolding operation.

An embodiment of the disclosure provides a folding terminal control apparatus, a folding terminal being provided with a first display area and a second display area between which an included angle changes along with folding or unfolding of the folding terminal, the folding terminal control apparatus, comprising:

a responding module, used for responding to an unfolding operation;

a control module, used for opening an application corresponding to folding angle information of the folding terminal, or accessing a mode corresponding to the folding angle information of the folding terminal.

An embodiment of the disclosure provides a terminal, including: at least one processor; a memory.

The memory configured to store at least one program; when the at least one program is executed by the at least one processor, the at least one processor implementing the folding terminal control method of any one of embodiment of the disclosure.

An embodiment of the disclosure provides a computer readable storage medium storing a computer program, the computer program being executed by a processor to implement the folding terminal control method according to any one of embodiment of the disclosure.

According to a folding terminal control method provided by an embodiment of the present disclosure, when a folding terminal in a folded state is unfolded to be in an unfolded state, a second application different from a first application may be opened automatically, so that a user does not need to manually open the second application, and the second application can be quickly called by changing unfolding and folding postures of the folding terminal, thereby improving the interactive use experience of the user.

BRIEF DESCRIPTION OF THE DRAWINGS

The above and other features, advantages and aspects of various embodiments of the present disclosure will become more apparent when taken in conjunction with the accompanying drawings and with reference to the following detailed description. Throughout the drawings, the same or similar reference numbers refer to the same or similar elements. It should be understood that the drawings are schematic and that elements and elements are not necessarily drawn to scale.

DETAILED DESCRIPTION OF THE EMBODIMENTS

Figure 1:
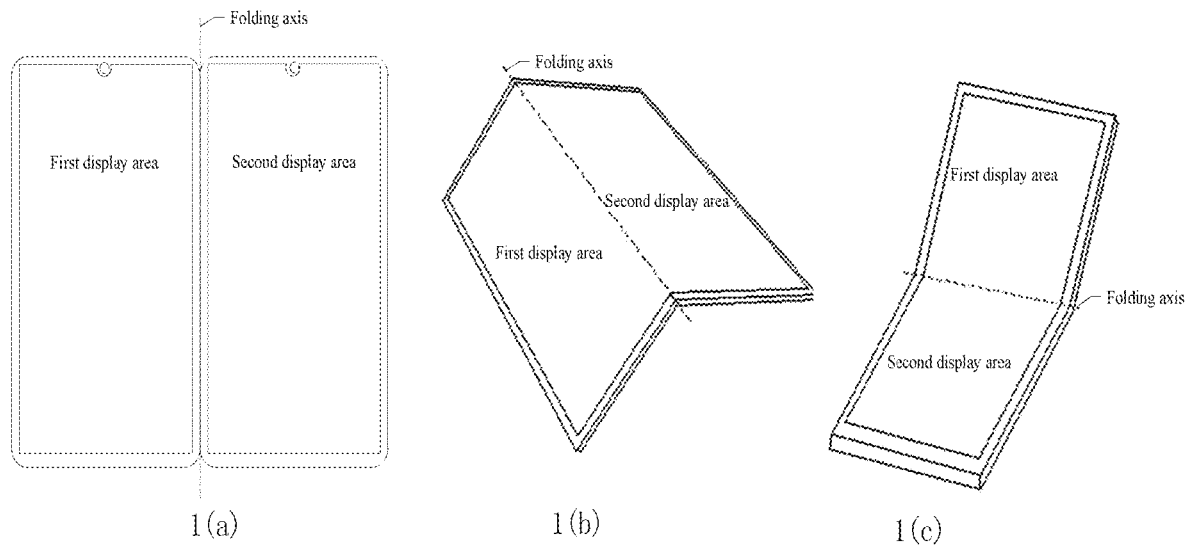
FIG. 1 is a schematic diagram of a folding terminal according to an embodiment of the present disclosure.

Embodiments of the present disclosure will be described in more detail below with reference to the accompanying drawings. While certain embodiments of the present disclosure are shown in the drawings, it should be understood that the present disclosure may be embodied in various forms and should not be construed as limited to the embodiments set forth herein, but rather are provided for the purpose of A more thorough and complete understanding of the present disclosure. It should be understood that the drawings and embodiments of the present disclosure are only for exemplary purposes, and are not intended to limit the protection scope of the present disclosure.

It should be understood that the various steps described in the method embodiments of the present disclosure may be performed in sequence and/or in parallel. Furthermore, method embodiments may include additional steps and/or omit performing the illustrated steps. The scope of the present disclosure is not limited in this regard.

As used herein, the term "including" and variations thereof are open-ended inclusions, ie, "including but not limited to". The term "based on" is "based at least in part on." The term "one embodiment" means "at least one embodiment"; the term "another embodiment" means "at least one additional embodiment"; the term "some embodiments" means "at least some embodiments". Relevant definitions of other terms will be given in the description below.

It should be noted that concepts such as "first" and "second" mentioned in the present disclosure are only used to distinguish different devices, modules or units, and are not used to limit the order of functions performed by these devices, modules or units or interdependence.

It should be noted that the modification of "a" mentioned in the present disclosure is illustrative rather than restrictive, and those skilled in the art should understand that unless the context clearly indicates otherwise, it should be understood as "one or more".

The names of messages or information exchanged between multiple devices in the embodiments of the present disclosure are only for illustrative purposes, and are not intended to limit the scope of these messages or information.

The solutions provided by the embodiments of the present application will be described in detail below with reference to the accompanying drawings.

An embodiment of the present disclosure provides a folding terminal control method. In the embodiment of the present disclosure, a folding terminal is provided with a first display area and a second display area, and an included angle between the first display area and the second display area changes along with folding or unfolding of the folding terminal. In some embodiments, when the folding terminal is in a folded state, the orientations of the first display area and the second display area are different, and the first display area and the second display area do not face a user simultaneously; and when the folding terminal is in an unfolded state, the first display area and the second display area can face the user simultaneously, and the user can operate the first display area and the second display area simultaneously. The folding terminal in some embodiments of the present disclosure may be a terminal with double screens or a flexible folding screen terminal. Referring to FIG. 1, FIG. 1 schematically shows three folding terminals which can use the control method provided by the embodiment of the present disclosure, and the first display area and the second display area are separated by a folding axis around which the folding terminal is folded. As shown in FIG. 1(*a*), the folding terminal in the embodiment of the present disclosure may be a terminal which uses double screens, one screen is the first display area, and the other screen is the second display area; as shown in FIG. 1(*b*) and FIG. 1(*c*), the folding terminal may be a flexible screen terminal, a flexible screen of the terminal may be folded to form the first display area and the a second display area, and when the flexible screen terminal is folded, an outward folding mode shown in FIG. 1(*b*) or an inward folding mode shown in FIG. 1(*c*) may be used; and the folding terminal in FIG. 1 may be bent around the folding axis.

Figure 2:
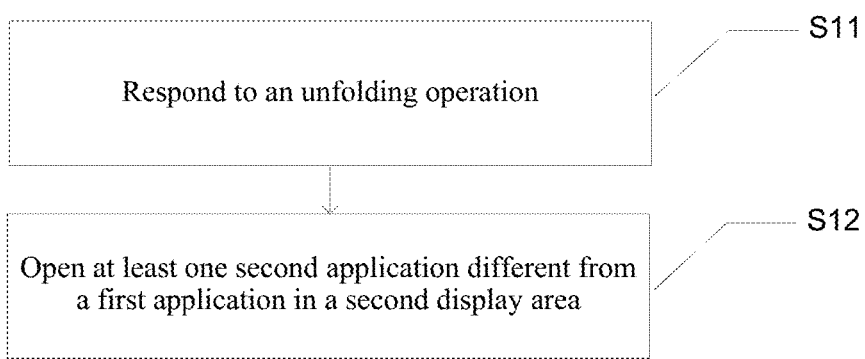
FIG. 2 is a flow chart of a folding terminal control method according to an embodiment of the present disclosure.

Referring to FIG. 2, a folding terminal control method in the embodiment of the present disclosure includes the following steps.

S11: Responding to an Unfolding Operation.

In some embodiments, a folding terminal may be in a folded state before responding to the unfolding operation. In the embodiment, a magnetic attraction sensor, an angle sensor or an acceleration sensor is arranged at a hinge part or a rotating shaft part of the folding terminal, and thus, the unfolding operation, a folding operation as well as current unfolding and folding postures and a folding angle of the folding terminal are identified. Of course, sensors, such as a magnetic attraction sensor, a P-sensor or an infrared transmitter, may also be added on other parts of the folding terminal, and thus, the unfolding operation, the folding operation as well as the current unfolding and folding postures and the folding angle of the folding terminal are identified.

S12: Opening at Least One Second Application Different from a First Application in a Second Display Area.

In some embodiments, the first application is an application which is running by the folding terminal before responding to the unfolding operation. In some embodiments, when the folding terminal is unfolded to be in the unfolded state from the folded state, the second application may be opened, so that a user does not need to manually open the second application, and the second application may be called directly, thereby improving the interactive use experience of the user. In the related art, after the folding terminal is switched from the folded state to the unfolded state, an interface of the application which is running is only enlarged, without a multitask design with regard to the unfolding operation, so that the use experience of the user is poor. It should be noted that, in some embodiments of the present disclosure, before the second application is opened, the second application may be in a closed state, or may be in a background running state or a background pausing state, and therefore, opening the second application in the embodiment of the present disclosure includes: not only opening the second application in the closed state, and also activating the second application from the background.

In some embodiments of the present disclosure, the first application runs in a first display area before and after responding to the unfolding operation. In the embodiment, when the folding terminal is in the folded state, the opened and running first application runs in the first display area, that is, in the folded state, the user performs interaction by operating the first display area. When the user performs the unfolding operation, the first application is still kept running in the first display area, and the user can continue operating the first application. For example, when the folding terminal is in the folded state, the first display area is an interactive interface of the folding terminal, the user performs operations in the first display area, the first application opened by the user runs in the first display area, at the moment, the second display area may be in a turn-off state, and the user cannot perform operations. When the unfolding operation is detected, the folding terminal is in the unfolded state, at the moment, the orientations of the first display area and the second display area are the same, that is, the first display area and the second display area may face the user simultaneously, at the moment, the second display area is activated and the second application is opened in the second display area, the user can thus operate the first display area and the second display area simultaneously in the unfolded state, at the moment, the first application is still running in the first display area, and therefore, the user can continue operating the first application in the first display area and can operate the second application, without the circumstance that the first application cannot be operated due to the fact that the second application is opened.

In some embodiments of the present disclosure, a running state of the first application keeps unchanged before and after responding to the unfolding operation. In the embodiment, if the first application is in the running state before responding to the unfolding operation, the first application is still in the running state after responding to the unfolding operation without being closed or switched because the second application is opened.

In some embodiments of the present disclosure, the folding terminal control method further includes: responding to the folding operation; and closing the second application of the second display area, or, closing the second application of the second display area and turning off the second display area.

In some embodiments, the opened second application is displayed in the second display area of the folding terminal in the unfolded state; when the folding terminal is in the folded state, the application is displayed and operations are performed in the first display area, when the folding terminal originally in the unfolded state detects the folding operation, it indicates that the user needs to operate the folding terminal in the folded state, and at the moment, the second application is closed. In the related art, when a flexible screen cell phone in the unfolded state is folded, a display range of a screen is often reduced, and in some embodiments of the present disclosure, the second application is closed, so that the application can be quickly closed without manual operation of the user. It should be noted that closing the second application in some embodiments of the present disclosure not only includes stopping the process of the second application, also includes running the second application in the background, and further includes pausing the second application and storing the second application in the background. In some optional embodiments, application states of various applications of the first display area keep unchanged before and after responding to the folding operation. For example, in the unfolded state, a browser is opened in the first display area, a calculator is opened in the second display area, and in response to the folding operation, the browser is kept opened in the first display area, and the calculator opened in the second display area is closed.

In some embodiments of the present disclosure, the folding terminal control method further includes: responding to the folding operation; and turning off the second display area. In some embodiments, the folding terminal is subjected to the folding operation, only the second display area is turned off, and the second application may be kept running and is not closed while a screen is turned off, so that the second application can be quickly opened when the user unfolds the folding terminal.

In some embodiments of the present disclosure, opening the at least one second application different from the first application in the second display area includes: opening at least one application corresponding to latest n notification messages in the second display area, wherein n≥1. In the embodiment, after the folding terminal is unfolded, applications corresponding to the first n notification messages are determined, and applications corresponding to the first n notification messages are second applications. When the n notification messages are multiple notification messages, there may be a plurality of second applications, that is, a plurality of second applications may be opened in the second display area at the same time, and one second application may correspond to one notification message.

Figure 3:
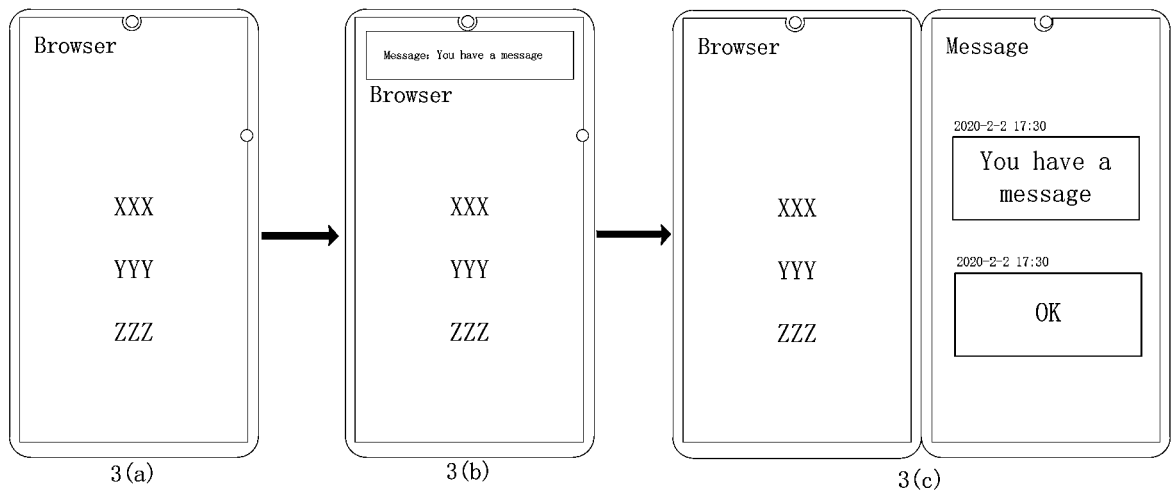
FIG. 3 is a schematic diagram showing display of a folding terminal in a folding terminal control method implementing process according to an embodiment of the present disclosure.

In order to better illustrate the beneficial effects of some embodiments of the present disclosure, the folding terminal control method in the embodiment of the present disclosure is described below with reference to FIG. 3(a) by taking n being 1 as an example, as shown in FIG. 3(a), when the folding terminal is in the folded state, the first application which is running currently is displayed in the first display area, the first application in FIG. 3(a) is a browser application, a screen area displayed in FIG. 3(a) is the first display area, as shown in FIG. 3(b), during the use of the browser application, a short message is received, and a short message application corresponding to the short message is the second application. In the embodiment, at the moment, the user can unfold the folding terminal, the folding terminal responds to the unfolding operation, the short message application is opened in the second display area and the short message is displayed without manual operation of the user. Optionally, as shown in FIG. 3(c), after responding to the unfolding operation, the first display area still keeps displaying the first application, so that the user can quickly view the latest n notification messages and reply without exiting the first application. In the related art, after a notification message is received, an application corresponding to the notification message needs to be manually opened by the user, and the application corresponding to the notification message after being opened can cover the previously used application. In the embodiment of the present disclosure, the circumstance that the previously used application cannot be used can be avoided while the notification messages are quickly viewed.

In some embodiments of the present disclosure, opening the at least one second application different from the first application in the second display area includes: opening at least one application which has a preset corresponding relationship with the first application in the second display area. In the embodiment of the present disclosure, the second application depends on the first application, and a corresponding relationship is preset between the first application and the second application, for example, a preset corresponding relationship may be set among a stock-investing application, a financing application and a calculator application, or a preset corresponding relationship may be set among a reading application, a translation application and a note application.

For example, the first application is a reading application, and a corresponding relationship of the reading application with the note application and the translation application is preset. In the folded state, the first display area is used as an interactive interface of the folding terminal, when the user reads an electronic book by using the reading application in the first display area, if the user wants to take notes or search for translation, the folding terminal may be unfolded, the first display area and the second display area are displayed at the same time, the note application and the translation application are automatically opened in the second display area, at the moment, the reading application can still run in the first display area, and after the user finishes taking notes, the folding terminal is folded, the note application and the translation application are closed in the second display area, and the user continues using the reading application in the first display area.

In some embodiments of the present disclosure, opening the at least one second application different from the first application in the second display area includes: opening at least one recently used application in the second display area. In the embodiment, after the folding terminal is unfolded, the recently used application is displayed in the second display area, for example, a background application may be directly displayed, so that the user may quickly switch the applications.

In some embodiments of the present disclosure, opening the at least one second application different from the first application in the second display area includes: opening at least one preset application in the second display area according to system settings or custom settings, so that the same one or more applications may be opened after the folding terminal is unfolded no matter what the first application is. In some embodiments, the second application is an application set by the user or is an application preset by the terminal. A payment application may be preset to be the second application, so that electronic payment may be directly achieved after the folding terminal is unfolded. In some embodiments, an enlarger application may be set to be the second application, so that text or images of the first application are automatically enlarged after the folding terminal is unfolded.

Figure 4:
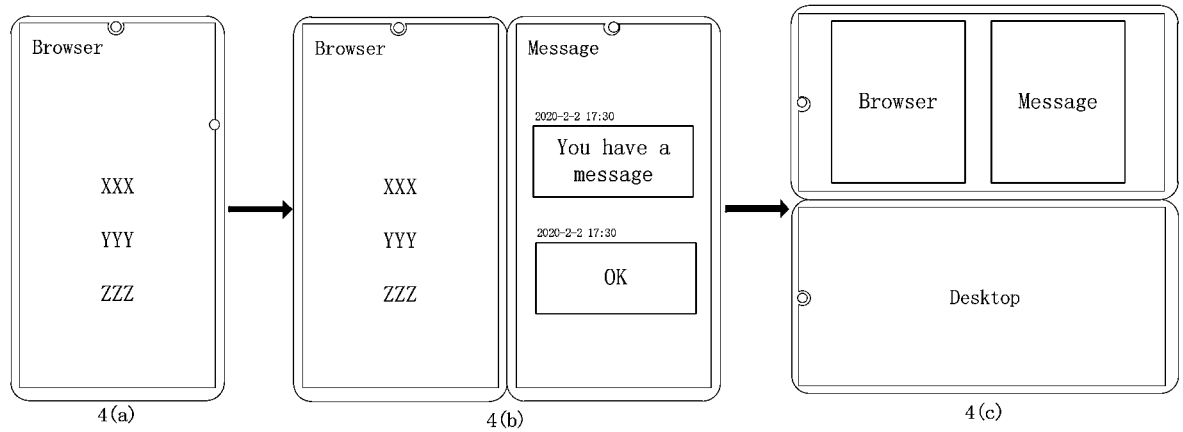
FIG. 4 is a schematic diagram showing display of a folding terminal in another folding terminal control method implementing process according to an embodiment of the present disclosure.

In some embodiments of the present disclosure, the folding terminal control method further includes: in the unfolded state, in response to a screen turning event from portrait display to landscape display, displaying at least one recently used application in the first display area, and displaying a desktop in the second display area, or, displaying at least one recently used application in the second display area, and displaying a desktop in the first display area. To better illustrate the embodiment, an example is provided in conjunction with FIG. 4, referring to FIG. 4(a), in the folded state, the first application (Browser) is displayed in the first display area shown in FIG. 4(a), and in the unfolded state, as shown in FIG. 4(b), the second application (Message) is opened in the second display area, at the moment, if the user rotates the folding terminal, that is, the screen turning event from portrait display to landscape display is triggered, as shown in FIG. 4(c), at least one recently used application is displayed in the first display area, and the desktop is displayed in the second display area, or, at least one recently used application is displayed in the second display area, and the desktop is displayed in the first display area. In this way, the user can quickly switch back to the desktop and view the latest applications, and the applications can be switched quickly by triggering any one of the latest applications. In some embodiments of the present disclosure, in the unfolded state, in response to the screen turning event from portrait display to landscape display, if the first display area is located above the second display area, at least one recently used application is displayed in the first display area, and the desktop is displayed in the second display area; and if the first display area is located below the second display area, at least one recently used application is displayed in the second display area, and the desktop is displayed in the first display area. In some embodiments of the present disclosure, the posture and orientation of the folding terminal are identified by means of a gravity sensor or a gyroscope, and a physical up-down relationship between the first display area and the second display area is determined according to the identified posture and orientation of the folding terminal. In some embodiments, when holding the terminal horizontally, the user is often used to holding and operating the display area located below, so that displaying the desktop in the display area located physically below may facilitate the operation of the user.

Figure 5:
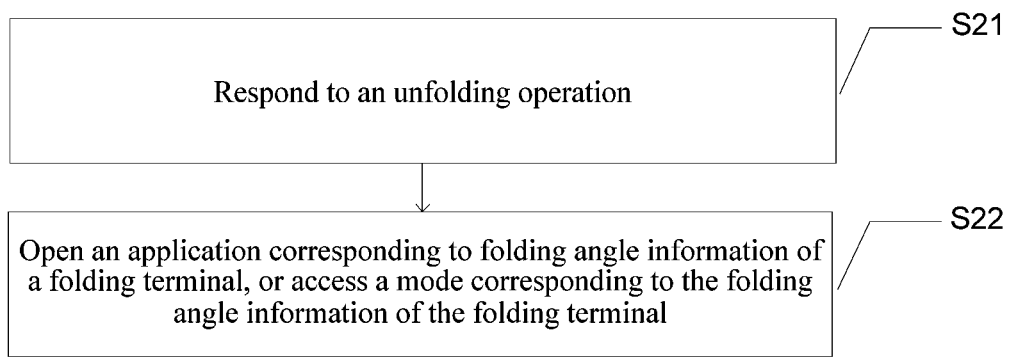
FIG. 5 is a flow chart of anther folding terminal control method according to an embodiment of the present disclosure.

In some embodiments of the present disclosure, another folding terminal control method is further provided. A folding terminal is provided with a first display area and a second display area, an included angle between the first display area and the second display area changes along with folding or unfolding of the folding terminal, a folding mode of the folding terminal may be an inward folding mode and may also be an outward folding mode, the folding terminal may use a flexible screen and may also use double screens to display, and as shown in FIG. 5, the folding terminal control method includes:

S21: Responding to an Unfolding Operation;

S22: Opening an Application Corresponding to Folding Angle Information of the Folding Terminal, or Accessing a Mode Corresponding to the Folding Angle Information of the Folding Terminal.

In some embodiments of the present disclosure, the folding angle information includes at least one of a folding angle of the folding terminal, a changing condition of the folding angle of the folding terminal, or a retention duration of the folding angle of the folding terminal. The folding angle of the folding terminal may be the included angle between the first display area and the second display area. The folding angle information may be detected by an angle sensor, the folding angle information reflects the posture of the folding terminal, different applications or different modes corresponding to different folding angle information are preset, different applications are opened correspondingly or different modes are accessed correspondingly according to the different folding angle information, and thus, a specific application may be quickly opened or a specific mode may be accessed without any touch-control operation of the user, thereby improving the user experience.

In some optional embodiments of the present disclosure, opening the application corresponding to the folding angle information of the folding terminal, or accessing the mode corresponding to the folding angle information of the folding terminal includes: opening a third application if the duration of the folding angle in a first angle range reaches a first duration. For example, the first angle range may be 170°-180°, the third application may be reading software, when the time of the folding angle of the folding terminal in the range reaches the first duration, the reading software is opened automatically, a reading mode is accessed, and thus, the user may quickly access the reading software at any time by adjusting the folding angle of the folding terminal.

In some optional embodiments of the present disclosure, opening the application corresponding to the folding angle information of the folding terminal, or accessing the mode corresponding to the folding angle information of the folding terminal includes: opening a fourth application in the second display area if a change value of the folding angle is within a second angle range for x times successively, wherein x is not less than 2. Some embodiments may be applicable to the circumstance that the folding terminal is in the unfolded state, for example, taking x being 2 as an example, the second angle range may be 15° to 30°, in the unfolded state, the user slightly folds the terminal twice to enable the change value of the folding angle to be within the second angle range twice successively, and then the third application is opened, wherein the third application, for example, may be an automatic word segmentation application, an optical word acquiring application, a translation application, a communication application or an enlarging application and the like; and by opening the third application, characters displayed in the first display area may be enlarged, are translated automatically, or are sent to other applications.

In some optional embodiments of the present disclosure, opening the application corresponding to the folding angle information of the folding terminal, or accessing the mode corresponding to the folding angle information of the folding terminal includes: turning off a display area of which an included angle with a horizontal plane is smaller than a first included angle and opening a fifth application in a display area which is not turned off if the folding angle is within a third angle range and an included angle between a plane on which any display area is located and the horizontal plane is smaller the first included angle. For example, taking the third angle range being 88°-92° as example, when the folding angle is in the third angle range, it indicates that the first display area and the second display area are perpendicular to each other, the included angle between one of the display areas and the horizontal plane is smaller than the first included angle, it indicates that the user wants to place one surface of the folding terminal on a horizontal plane such as a table, thus, the display area which will be placed on the horizontal plane will be turned off, and at the moment, the display area which is not placed on the horizontal plane displays the fifth application which may be a video application or an office application; and if the fifth application is the video application, videos will be played automatically, and brightness and volume of the video application are adjusted according to ambient light intensity and ambient sound intensity.

Figure 6:
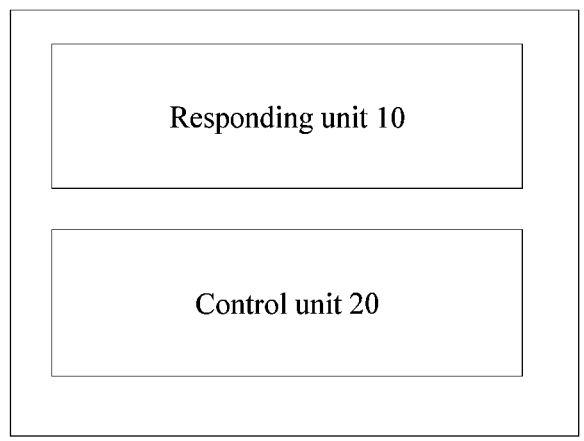
FIG. 6 is a constitutional diagram of a folding terminal control apparatus according to an embodiment of the present disclosure.

As shown in FIG. 6, an embodiment of the present disclosure further provides a folding terminal control apparatus. A folding terminal is provided with a first display area and a second display area, an included angle between the first display area and the second display area changes along with folding or unfolding of the folding terminal, and the control apparatus includes:

a responding unit 10, used for responding an unfolding operation;

a control unit 20, used for opening at least one second application different from a first application in the second display area;

wherein the first application is an application which is running by the folding terminal before responding to the unfolding operation.

In some embodiments, before and after the responding unit 10 responds to the unfolding operation, the first application runs in the first display area.

In some embodiments, before and after the responding unit 10 responds to the unfolding operation, a running state of the first application keeps unchanged.

In some embodiments, the responding unit 10 is further used for responding to a folding operation, the control unit 20 is further used for closing the second application in the second display area.

In some embodiments, the responding unit 10 is further used for responding to the folding operation, and the control unit 20 is further used for turning off the second display area.

In some embodiments, the responding unit 10 is further used for responding to the folding operation, the control unit 20 is further used for closing the second application in the second display area and turning off the second display area.

In some embodiments, the control unit 20 opens at least one second application different from the first application in the second display area, and includes: opening at least one application corresponding to latest n notification messages in the second display area, wherein n≥1.

In some embodiments, the control unit 20 opens at least one second application different from the first application in the second display area, and includes: opening at least one application which has a preset corresponding relationship with the first application in the second display area.

In some embodiments, the control unit 20 opens at least one second application different from the first application in the second display area, and includes: opening at least one recently used application in the second display area.

In some embodiments, the control unit 20 opens at least one second application different from the first application in the second display area, and includes: opening at least one preset application in the second display area according to system settings or custom settings.

In some embodiments, the responding unit 10 is further used for responding to a screen turning event from portrait display to landscape display in the unfolded state, the control unit 20 is further used for displaying at least one recently used application in the first display area and displaying a desktop in the second display area, or displaying at least one recently used application in the second display area and displaying a desktop in the first display area.

Figure 7:
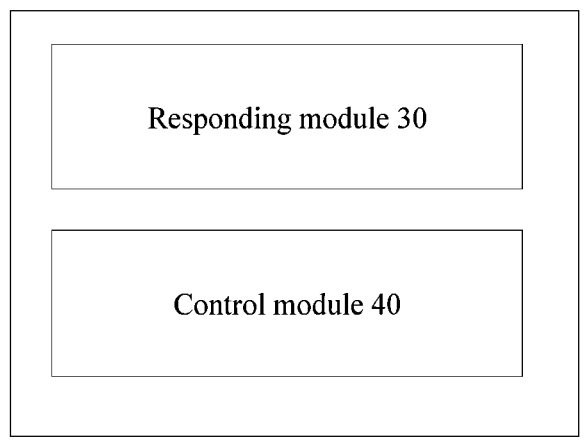
FIG. 7 is a constitutional diagram of another folding terminal control apparatus according to an embodiment of the present disclosure.

As shown in FIG. 7, an embodiment of the present disclosure further provides another folding terminal control apparatus. A folding terminal is provided with a first display area and a second display area, an included angle between the first display area and the second display area changes along with folding or unfolding of the folding terminal, and the folding terminal control apparatus includes:

a responding module 30, used for responding to an unfolding operation;

a control module 40, used for opening an application corresponding to folding angle information of the folding terminal, or accessing a mode corresponding to the folding angle information of the folding terminal.

In some embodiments, the folding angle information includes at least one of a folding angle of the folding terminal, a changing condition of the folding angle of the folding terminal or a retention duration of the folding angle of the folding terminal.

In some embodiments, the control module 40 opens an application corresponding to the folding angle information of the folding terminal, or accesses a mode corresponding to the folding angle information of the folding terminal, and includes:

opening a third application if the duration of the folding angle in a first angle range reaches a first duration; or opening a fourth application in the second display area if a change value of the folding angle is in a second angle range for x time successively, wherein x is not less than 2; or turning off a display area of which an included angle with a horizontal plane is smaller than a first included angle and opening a fifth application in a display area which is not turned off if the folding angle is in a third angle range and an included angle between a plane on which any display area is located and the horizontal plane is smaller than the first included angle.

As for the embodiment of the apparatus, since it basically corresponds to the embodiment of the method, reference may be made to the partial description of the embodiment of the method for the second terminal for related parts. The apparatus embodiments described above are merely illustrative, wherein the modules described as separate modules may or may not be separate. Some or all of the modules may be selected according to actual needs to achieve the purpose of the solution in this embodiment. Those of ordinary skill in the art can understand and implement it without creative effort.

The control method and device for a folding terminal of the present disclosure have been described above based on the embodiments and application examples. In addition, the present disclosure also provides a terminal and a storage medium, which are described below.

Figure 8:
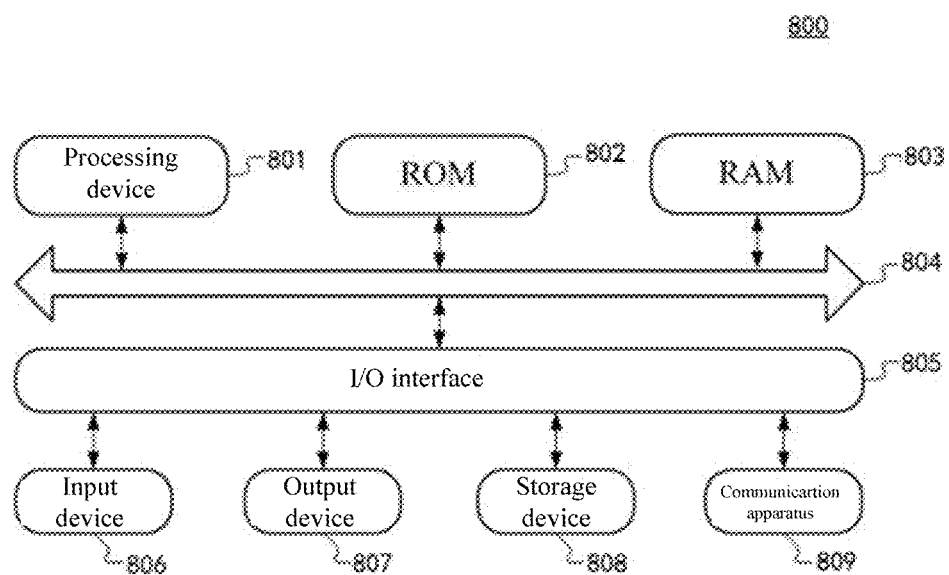
FIG. 8 is a structure diagram of an electronic device according to an embodiment of the present disclosure.

Referring to FIG. 8, it shows a schematic structural diagram of an electronic device (eg, a terminal device or a server) 800 suitable for implementing an embodiment of the present disclosure. Terminal devices in the embodiments of the present disclosure may include, but are not limited to, mobile phones, notebook computers, digital broadcast receivers, PDAs (Personal Digital Assistants), PADs (Tablet Computers), PMPs (Portable Multimedia Players), in-vehicle terminals (eg, mobile terminals such as in-vehicle navigation terminals), etc., and stationary terminals such as digital TVs, desktop computers, and the like. The electronic device shown in FIG. 8 is only an example, and should not impose any limitation on the function and scope of use of the embodiments of the present disclosure.

As shown in FIG. 8, an electronic device 800 may include a processing device (eg, a central processing unit, a graphics processor, etc.) 801 that may be loaded into random access according to a program stored in a read only memory (ROM) 802 or from a storage device 808 Various appropriate actions and processes are executed by the programs in the memory (RAM) 803. In the RAM 803, various programs and data necessary for the operation of the electronic device 800 are also stored. The processing device 801, the ROM 802, and the RAM 803 are connected to each other through a bus 804. An input/output (I/O) interface 805 is also connected to bus 804.

Typically, the following devices can be connected to the I/O interface 805: input devices 806 including, for example, a touch screen, touchpad, keyboard, mouse, camera, microphone, accelerometer, gyroscope, etc.; including, for example, a liquid crystal display (LCD), speakers, vibration an output device 807 of a computer, etc.; a storage device 808 including, for example, a magnetic tape, a hard disk, etc.; and a communication apparatus 809. Communication apparatus 809 may allow electronic device 800 to communicate wirelessly or by wire with other devices to exchange data. While FIG. 8 shows an electronic device 800 having various means, it should be understood that not all of the illustrated means are required to be implemented or provided. More or fewer devices may alternatively be implemented or provided.

In particular, according to embodiments of the present disclosure, the processes described above with reference to the flowcharts may be implemented as computer software programs. For example, embodiments of the present disclosure include a computer program product comprising a computer program carried on a computer-readable medium, the computer program containing program code for performing the method illustrated in the flowchart. In such an embodiment, the computer program may be downloaded and installed from the network via the communication apparatus 809, or from the storage device 808, or from the ROM 802. When the computer program is executed by the processing device 801, the above-mentioned functions defined in the methods of the embodiments of the present disclosure are executed.

It should be noted that the computer-readable medium mentioned above in the present disclosure may be a computer-readable signal medium or a computer-readable storage medium, or any combination of the above two. The computer-readable storage medium can be, for example, but not limited to, an electrical, magnetic, optical, electromagnetic, infrared, or semiconductor system, apparatus or device, or a combination of any of the above. More specific examples of computer readable storage media may include, but are not limited to, electrical connections with one or more wires, portable computer disks, hard disks, random access memory (RAM), read only memory (ROM), erasable Programmable read only memory (EPROM or flash memory), optical fiber, portable compact disk read only memory (CD-ROM), optical storage devices, magnetic storage devices, or any suitable combination of the above. In this disclosure, a computer-readable storage medium may be any tangible medium that contains or stores a program that can be used by or in conjunction with an instruction execution system, apparatus, or device. In the present disclosure, however, a computer-readable signal medium may include a data signal propagated in baseband or as part of a carrier wave with computer-readable program code embodied thereon. Such propagated data signals may take a variety of forms, including but not limited to electromagnetic signals, optical signals, or any suitable combination of the foregoing. A computer-readable signal medium can also be any computer-readable medium other than a computer-readable storage medium that can transmit, propagate, or transport the program for use by or in connection with the instruction execution system, apparatus, or device. Program code embodied on a computer readable medium may be transmitted using any suitable medium including, but not limited to, electrical wire, optical fiber cable, RF (radio frequency), etc., or any suitable combination of the foregoing.

In some embodiments, the client and server can use any currently known or future developed network protocol such as HTTP (HyperText Transfer Protocol) to communicate, and can communicate with digital data in any form or medium Communication (eg, communication network) interconnection. Examples of communication networks include local area networks ("LAN"), wide area networks ("WAN"), the Internet (eg, the Internet), and peer-to-peer networks (eg, ad hoc peer-to-peer networks), as well as any currently known or future developed network.

The above-mentioned computer-readable medium may be included in the above-mentioned electronic device; or may exist alone without being assembled into the electronic device.

The aforementioned computer-readable medium carries one or more programs, which, when executed by the electronic device, cause the electronic device to execute the aforementioned method of the present disclosure.

Computer program code for carrying out operations of the present disclosure may be written in one or more programming languages, including object-oriented programming languages—such as Java, Smalltalk, C++, but also conventional Procedural programming language—such as the "C" language or similar programming language. The program code may execute entirely on the users computer, partly on the users computer, as a stand-alone software package, partly on the user's computer and partly on a remote computer, or entirely on the remote computer or server. In the case of a remote computer, the remote computer may be connected to the user's computer through any kind of network, including a local area network (LAN) or a wide area network (WAN), or may be connected to an external computer (eg, using an Internet service provider via Internet connection).

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code that contains one or more functions for implementing the specified logical function(s) executable instructions. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It is also noted that each block of the block diagrams and/or flowchart illustrations, and combinations of blocks in the block diagrams and/or flowchart illustrations, can be implemented in dedicated hardware-based systems that perform the specified functions or operations, or can be implemented in a combination of dedicated hardware and computer instructions.

The units involved in the embodiments of the present disclosure may be implemented in a software manner, and may also be implemented in a hardware manner. Among them, the name of the unit does not constitute a limitation of the unit itself under certain circumstances.

The functions described herein above may be performed, at least in part, by one or more hardware logic components. For example, without limitation, exemplary types of hardware logic components that may be used include: Field Programmable Gate Arrays (FPGAs), Application Specific Integrated Circuits (ASICs), Application Specific Standard Products (ASSPs), Systems on Chips (SOCs), Complex Programmable Logical Devices (CPLDs) and more.

In the context of the present disclosure, a machine-readable medium may be a tangible medium that may contain or store a program for use by or in connection with the instruction execution system, apparatus or device. The machine-readable medium may be a machine-readable signal medium or a machine-readable storage medium. Machine-readable media may include, but are not limited to, electronic, magnetic, optical, electromagnetic, infrared, or semiconductor systems, devices, or devices, or any suitable combination of the foregoing. More specific examples of machine-readable storage media would include one or more wire-based electrical connections, portable computer disks, hard disks, random access memory (RAM), read only memory (ROM), erasable programmable read only memory (EPROM or flash memory), fiber optics, compact disk read only memory (CD-ROM), optical storage devices, magnetic storage devices, or any suitable combination of the foregoing.

According to one or more embodiments of the present disclosure, provide a folding terminal control method, a folding terminal being provided with a first display area and a second display area between which an included angle changes along with folding or unfolding of the folding terminal, the folding terminal control method comprising:
  responding to an unfolding operation, opening at least one second application different from a first application in the second display area;
  wherein the first application is an application which is running by the folding terminal before responding to the unfolding operation.

According to one or more embodiments of the present disclosure, provide a folding terminal control method, before and after responding to the unfolding operation, the first application runs in the first display area;
  and/or,
  before and after responding to the unfolding operation, a running state of the first application keeps unchanged.

According to one or more embodiments of the present disclosure, provide a folding terminal control method, further comprising:
  responding to a folding operation, and closing the second application of the second display area; or,
  responding to the folding operation, and turning off the second display area; or,
  responding to the folding operation, closing the second application of the second display area and turning off the second display area.

According to one or more embodiments of the present disclosure, provide a folding terminal control method, wherein opening the at least one second application different from the first application in the second display area comprises:
  opening at least one application corresponding to latest n notification messages in the second display area, wherein n≥1.

According to one or more embodiments of the present disclosure, provide a folding terminal control method, wherein opening the at least one second application different from the first application in the second display area comprises:
  opening at least one application which has a preset corresponding relationship with the first application in the second display area.

According to one or more embodiments of the present disclosure, provide a folding terminal control method, wherein opening the at least one second application different from the first application in the second display area comprises:
  opening at least one recently used application in the second display area.

According to one or more embodiments of the present disclosure, provide a folding terminal control method, wherein opening the at least one second application different from the first application in the second display area comprises:
  opening at least one preset application in the second display area according to system settings or custom settings.

According to one or more embodiments of the present disclosure, provide a folding terminal control method, further comprising:

in an unfolded state, in response to a screen turning event from portrait display to landscape display, displaying at least one recently used application in the first display area, displaying a desktop in the second display area, or displaying the at least one recently used application in the second display area, and displaying the desktop in the first display area.

According to one or more embodiments of the present disclosure, provide a folding terminal control method, a folding terminal being provided with a first display area and a second display area between which an included angle changes along with folding or unfolding of the folding terminal, the folding terminal control method comprising:

responding to an unfolding operation;

opening an application corresponding to folding angle information of the folding terminal, or accessing a mode corresponding to the folding angle information of the folding terminal.

According to one or more embodiments of the present disclosure, provide a folding terminal control method, wherein the folding angle information comprises at least one of a folding angle of the folding terminal, a changing condition of the folding angle of the folding terminal, or a retention duration of the folding angle of the folding terminal.

According to one or more embodiments of the present disclosure, provide a folding terminal control method, wherein opening the application corresponding to the folding angle information of the folding terminal, or accessing the mode corresponding to the folding angle information of the folding terminal comprises:

opening a third application in the case that the duration of the folding angle within a first angle range reaches a first duration; or, opening a fourth application in the second display area in the case that a change value of the folding angle is within a second angle range for x times successively, wherein x is not less than 2; or, turning off a display area of which an included angle with a horizontal plane is smaller than a first included angle, and opening a fifth application in a display area which is not turned off in the case that the folding angle is within a third angle range and an included angle between a plane on which any display area is located and the horizontal plane is smaller than the first included angle.

According to one or more embodiments of the present disclosure, provide a folding terminal control apparatus, a folding terminal being provided with a first display area and a second display area between which an included angle changes along with folding or unfolding of the folding terminal, the folding terminal control apparatus, comprising:

a responding unit, used for responding to an unfolding operation;

a control unit, used for opening at least one second application different from a first application in the second display area; wherein the first application is an application which is running by the folding terminal before responding to the unfolding operation.

According to one or more embodiments of the present disclosure, provide a folding terminal control apparatus, a folding terminal being provided with a first display area and a second display area between which an included angle changes along with folding or unfolding of the folding terminal, the folding terminal control apparatus, comprising:

a responding module, used for responding to an unfolding operation;

a control module, used for opening an application corresponding to folding angle information of the folding terminal, or accessing a mode corresponding to the folding angle information of the folding terminal.

According to one or more embodiments of the present disclosure, provide a terminal, comprising: at least one memory or at least one processor, wherein the at least one memory is used for storing program codes and the at least one processor is used for calling the program codes stored in the at least one memory to execute the method of any one of embodiments of the folding terminal control method.

According to one or more embodiments of the present disclosure, provide a computer readable storage medium storing a computer program, the computer program being executed by a processor to implement the folding terminal control method according to any one of embodiment of the disclosure.

The above description is merely a preferred embodiment of the present disclosure and an illustration of the technical principles employed. Those skilled in the art should understand that the scope of disclosure involved in the present disclosure is not limited to the technical solutions formed by the specific combination of the above-mentioned technical features, and should also cover, without departing from the above-mentioned disclosed concept, the technical solutions formed by the above-mentioned technical features or Other technical solutions formed by any combination of its equivalent features. For example, a technical solution is formed by replacing the above features with the technical features disclosed in the present disclosure (but not limited to) with similar functions.

Additionally, although operations are depicted in a particular order, this should not be construed as requiring that the operations be performed in the particular order shown or in a sequential order. Under certain circumstances, multi-tasking and parallel processing may be advantageous. Likewise, although the above discussion contains several implementation-specific details, these should not be construed as limitations on the scope of the present disclosure. Certain features that are described in the context of separate embodiments can also be implemented in combination in a single embodiment. Conversely, various features that are described in the context of a single embodiment can also be implemented in multiple embodiments separately or in any suitable sub combination.

Although the subject matter has been described in language specific to structural features and/or logical acts of method, it is to be understood that the subject matter defined in the appended claims is not necessarily limited to the specific features or acts described above. Rather, the specific features and acts described above are merely example forms of implementing the claims.

What is claimed is:

1. A folding terminal control method, a folding terminal being provided with a first display area and a second display area between which an included angle changes along with folding or unfolding of the folding terminal, the folding terminal control method comprising:

responding to an unfolding operation, opening at least one second application different from a first application in the second display area;

wherein the first application is an application which is running by the folding terminal before responding to the unfolding operation;

the method further comprising:
in an unfolded state, in response to a screen turning event from portrait display to landscape display, the portrait display having the first application displayed in the first display area and the second application displayed in the second display area:
displaying the first application and the second application in the first display area and displaying a desktop in the second display area.

2. The folding terminal control method according to claim 1, wherein
before and after responding to the unfolding operation, the first application runs in the first display area;
and/or,
before and after responding to the unfolding operation, a running state of the first application keeps unchanged.

3. The folding terminal control method according to claim 1, further comprising:
responding to a folding operation, and closing the second application of the second display area; or,
responding to the folding operation, and turning off the second display area; or,
responding to the folding operation, closing the second application of the second display area and turning off the second display area.

4. The folding terminal control method according to claim 1, wherein opening the at least one second application different from the first application in the second display area comprises:
opening at least one application corresponding to latest n notification messages in the second display area, wherein n≥1.

5. The folding terminal control method according to claim 1, wherein opening the at least one second application different from the first application in the second display area comprises: opening at least one application which has a preset corresponding relationship with the first application in the second display area.

6. The folding terminal control method according to claim 1, wherein opening the at least one second application different from the first application in the second display area comprises: opening at least one recently used application in the second display area.

7. The folding terminal control method according to claim 1, wherein opening the at least one second application different from the first application in the second display area comprises: opening at least one preset application in the second display area according to system settings or custom settings.

8. A folding terminal control apparatus, a folding terminal being provided with a first display area and a second display area between which an included angle changes along with folding or unfolding of the folding terminal, the folding terminal control apparatus, comprising:
at least one processor; and at least one memory communicatively coupled to the at least one processor and storing instructions that upon execution by the at least one processor cause the apparatus to perform operations comprising:
responding to an unfolding operation, opening at least one second application different from a first application in the second display area;
wherein the first application is an application which is running by the folding terminal before responding to the unfolding operation;
the operations further comprising:
in an unfolded state, in response to a screen turning event from portrait display to landscape display, the portrait display having the first application displayed in the first display area and the second application displayed in the second display area:
displaying the first application and the second application in the first display area and displaying a desktop in the second display area.

* * * * *